(12) United States Patent
Eggers

(10) Patent No.: US 7,851,134 B2
(45) Date of Patent: Dec. 14, 2010

(54) METHOD FOR EXPOSURE OF FLEXO PRINTING PLATES

(75) Inventor: Stefan Eggers, Wentorf (DE)

(73) Assignee: Xeikon IP BV, GZ Eede (NL)

( * ) Notice: Subject to any disclaimer, the term of this patent is extended or adjusted under 35 U.S.C. 154(b) by 1198 days.

(21) Appl. No.: 11/480,619

(22) Filed: Jul. 3, 2006

(65) Prior Publication Data

US 2007/0014929 A1 Jan. 18, 2007

(30) Foreign Application Priority Data

Jul. 2, 2005 (DE) .................. 10 2005 031 057

(51) Int. Cl.
*G03F 7/20* (2006.01)
(52) U.S. Cl. .................. 430/302; 430/394; 101/463.1
(58) Field of Classification Search .................. 430/300, 430/301, 394, 302; 101/401.1, 463.1, 465, 101/467; 355/35
See application file for complete search history.

(56) References Cited

U.S. PATENT DOCUMENTS

| | | | | |
|---|---|---|---|---|
| 3,833,384 | A | * | 9/1974 | Noonan et al. ........... 430/277.1 |
| 4,485,167 | A | * | 11/1984 | Briney et al. ............. 430/281.1 |
| 4,720,448 | A | | 1/1988 | Mousseau |
| 2002/0058196 | A1 | | 5/2002 | Kanga |
| 2004/0177782 | A1 | | 9/2004 | McCrea et al. ............. 101/453 |
| 2005/0011382 | A1 | | 1/2005 | Donahue et al. |
| 2005/0266358 | A1 | | 12/2005 | Roberts et al. ............. 430/306 |

FOREIGN PATENT DOCUMENTS

| EP | 0295818 | 6/1988 |
|---|---|---|
| WO | WO2005/119366 | 12/2005 |

\* cited by examiner

*Primary Examiner*—Cynthia H Kelly
*Assistant Examiner*—Anca Eoff
(74) *Attorney, Agent, or Firm*—Collard & Roe, P.C.

(57) ABSTRACT

In order to improve a method for producing a structure of polymerisation picture points (9) in a light-sensitive layer (2) of printing plates (3), in particular flexo-printing plates, as an image of picture data composed from a matrix (17) of picture points, by way of structured exposure with a light source, to the extent that an improved tonal range of the print picture is achieved and simultaneously that the manufacturing time is reduced, it is suggested for each polymerisation picture point (9) to be produced by an individual exposure sequence (6, 8, 11) which on the one hand is selected in dependence on the surface density of the polymerisation picture points (9) to be set at the location (A, B, C, D) of the polymerisation picture point (9) and one the other hand in dependence on the picture data.

19 Claims, 6 Drawing Sheets

Figure 1:
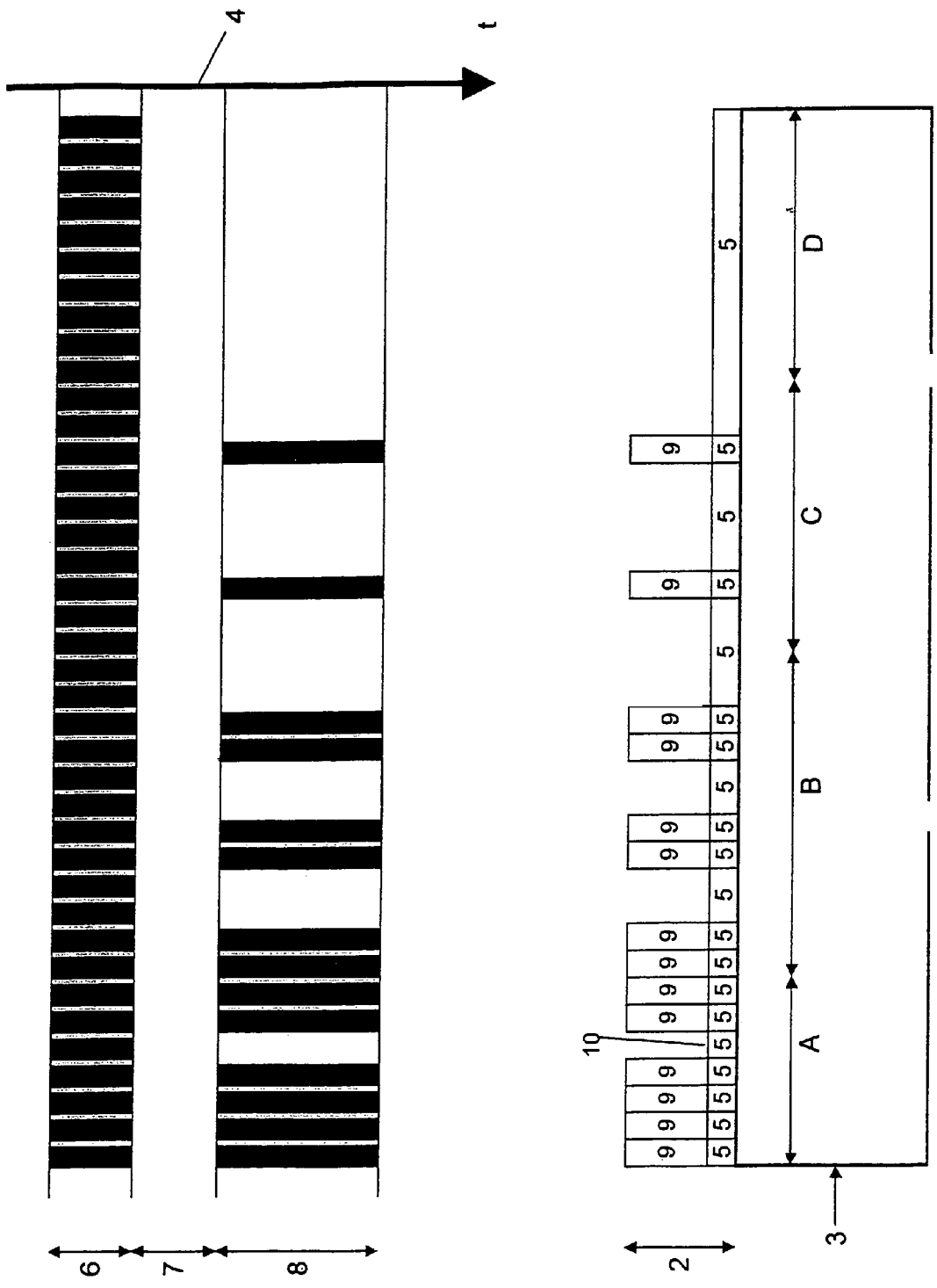

(a)
C
17

B
17

(b)
17

17

(c)
17

17

METHOD FOR EXPOSURE OF FLEXO PRINTING PLATES

CROSS REFERENCE TO RELATED APPLICATIONS

Applicant claims priority under 35 U.S.C. §119 of German Application No. 10 2005 031 057.5 filed Jul. 2, 2005.

The present invention relates to a method for producing a structure of photo-polymerisation picture points in the light-sensitive layer of printing plates, in particular flexo-printing plates, as an image of picture data composed of a matrix of picture points, by way of structured exposure with a light source.

Such methods are applied in combination with letter press printing. Thereby, the printing elements are increased. The printing plates are provided with a layer of light-sensitive material, onto which the method according to the known type, for producing the printing elements by way of photo-polymerisation, is applied. The exposure is effected typically by way of UV-exposure. With the w-exposure of the printing plates, chemical constituents of the layer are polymerised, i.e. chained. With the exposure procedure, free oxygen present in the light-sensitive layer counteracts this UV-induced polymerisation. The oxygen must therefore be firstly locally bonded for the production of picture points by way of UV-exposure, before the polymerisation may set in. This bonding is a reversible process, which forms back again within minutes inasmuch as no continued polymerisation is effected at the point concerned.

A few problems result on exposure of the printing plates due these chemical occurrences. If specifically, weakly covered surfaces, so-called "highlights" are to be exposed, the post-diffusing oxygen from the unexposed adjacent regions weakens the polymerisation of the picture point. This leads to the fact that the required exposure time for producing the photo-polymerisation picture point is increased. In the extreme case of particularly small raster points, it may as a whole be impossible to produce the picture point by way of polymerisation, in a manner such that it is firmly connected to the printing plate.

Against this background, an exposure method has become commonplace, with which the printing plates are firstly subjected to an unstructured preliminary exposure and are subsequently finally exposed with a certain time delay. The unstructured preliminary exposure is called "prebump" or "bump". It is applied to the whole surface of the printing late. It has been shown that the production of picture points also in regions of only weakly covered surfaces ("highlights") is only made possible in the first place when carrying out such an unstructured preliminary exposure.

However, on the other hand, it has been shown that in highly-covered surfaces, thus surfaces with a large surface density of polymerisation picture points to be produced—so-called "shadows"—that the unstructured preliminary exposure leads to the fact that small holes in the otherwise almost completely closed surfaces likewise polymerise in an undesired manner. This is explained by the fact that the unbonded oxygen initially contained in the light-sensitive layer is required, in order to keep the small holes in the almost completely closed surface open. Thus, the unstructured preliminary exposure for the exposure of the highly covered surfaces (shadows) is counter-productive.

In practice therefore, one waits for a time of typically between 20 and 60 seconds after the effected unstructured preliminary exposure, until the actual structured exposure is carried out. According to theory, the reversibly undergone bonding of the free oxygen reverses to a certain extent within this time.

This renewed release of the oxygen as explained, is advantageous or necessary for the highly covered surfaces, but simultaneously is disadvantageous for the production of the weakly covered surfaces.

With the known and common method of unstructured preliminary exposure, it is therefore the case of finding a compromise by way of the selection of a suitable waiting time, to the extent that the concentration of the free oxygen on the one hand is high enough in order to keep open small holes in the almost covered surface, and on the other hand not to let the concentration of the newly arising free oxygen increase to the extent that the complete polymerisation of the polymerisation picture points is no longer possible in the weakly covered surfaces. This compromise which is made according to the known methods, leads to the fact that the exposure conditions in the highly covered surfaces as well as at the only weakly covered surfaced are sub-optimal. The tonal range of a flexo-plate is limited on account of this to approx. 10% to 90%.

Since the necessary exposure times for shadows and highlights may be different by a factor of 10 to 100, with the exposure according to the described conventional method, a 10 to 100 multiple of overexposure of the shadows is carried out. This however disadvantageously leads to the fact that small holes grow together in almost completely covered surfaces.

Furthermore, the waiting time between unstructured preliminary exposure and the actual structured exposure is disadvantageous for the processing time of the printing plates, if a digital exposure or a direct exposure is applied. In particular, if optimisation algorithms for leaving out non-exposed picture regions are applied, a constant time difference between the preliminary exposure and the structured exposure represents a considerable problem in the control of the procedure.

Against this background, a method is described in US 2002/058196A1 with which the unstructured preliminary exposure is only applied to the non-covered picture regions at which therefore no photo-polymerisation picture points are to be produced. The result therefore on preliminary exposure is that the inverted picture (the negative) is exposed. The aim of the previously known method is a significant reduction or elimination of the waiting time between preliminary exposure and the actual exposure, which is necessary with the common methods, and an improvement in the printing quality. Thus with the known method, the preliminary exposure is not effected in an unstructured manner but in dependence on the picture to be produced as its inversion. First trials however, in practise, have shown only mixed results with this method. In particular a "closing-up" of holes in shadow regions could not be avoided in individual cases. Systematic results are not yet present.

It is therefore the object of the present invention to improve a method for producing a structure of photo-polymerisation picture points in the light sensitive layer of printing plates of the initially mentioned type, to the extent that an improved tonal range of the print picture is achieved, and simultaneously the manufacturing time is reduced.

This object is achieved according to the present invention in that each photo-polymerisation picture point is produced by an individual exposure sequence selected on the one hand in dependence on the surface density of the photo-polymerisation picture points to be set at the location of the photo-polymerisation picture point, and on the other hand in dependence on the picture data, wherein at non-set picture points, which are located at locations with medium surface density, non-printing photo-polymerisation subsurface points are produced with a preliminary exposure sequence (bump), comprising the following step:

a. exposure with a preliminary exposure dose for bonding the oxygen contained in the light-sensitive layer, wherein the preliminary exposure dose is selected such that photo-polymerisation is still not yet effected, and wherein at set picture points, printing photo-polymerisation picture points are produced with a standard sequence (main) independently of the surface density, comprising the following steps a. exposure with the mentioned preliminary exposure dose,
b. exposure with a structure intensification dose, wherein the structure intensification dose is selected such that it, together with the preliminary exposure dose, produces a condition in which the print layer essentially may no longer be completely developed,
c. exposure with a standard dose, wherein the standard dose is selected such that it together with the preliminary exposure dose and the structure intensification dose, at locations with the greatest surface density, effects a complete photo-polymerisation of the photo-polymerisation picture point, and wherein no exposure is effected at non-set picture points which are located at locations with a large surface density.

The surface density of the photo-polymerisation picture points to be set, within the scope of the present application, means that ratio of the number of picture points in a surface element, which are to be set according to the picture data contained in the matrix, in relation to the total number of picture points which results from the sum of the set and non-set picture points which are contained in this surface element. The extension of the surface element which is usefully to be observed depends on the divergence of the light source and of the layer thickness, the layer construction as well as the material of the printing plate. In practise, one would often limit oneself to the observation of the two next neighbours on account of the ratio of the pixel size to the mentioned influence variables.

The advantage of the method according to the invention compared to the known method is the fact that the exposure sequence of one and each photo-polymerisation picture points is not only dependent on the picture information for this point itself, but that rather, moreover by way of determining the surface density, one also takes into account the environment of the photo-polymerisation picture point to be produced. According to the invention, no preliminary exposure is effected in regions of highly covered surfaces, thus regions with a large surface density. This advantageously leads to the fact that on account of the chemical processes described above, it is much more easily possible to keep open small holes in an otherwise almost completely closed surface.

Simultaneously however, and advantageously, by way of the inventive selection of the exposure sequence in dependence on the surface density, one is provided with the possibility of carrying out a preliminary exposure at locations with a particularly small surface density, thus in the region of only weakly covered surfaces ("highlights"), in order to bond the oxygen contained in the light-sensitive layer. By way of this, one advantageously prevents the extension of the exposure time for producing the printing photo-polymerisation picture points on account of the free oxygen.

Whereas with known exposure methods, a compromise must be made which leads to the fact that the exposure conditions are neither optimal for the greatly covered shadow regions nor for the weakly covered highlight regions, the inventive selection of the exposure sequence advantageously permits the preparation of a respective optimal exposure sequence for each picture point to be set and not to be set, in dependence on the surface density of the photo-polymerisation picture points to be set. Advantageously, in particular a waiting time between the preliminary exposure and the actual exposure is completely done away with.

Advantageously, no waiting time is provided between the steps of the exposure sequence which are provided according to the invention. The doses are deposited in a directly successive manner, so that they may add to a complete dose within each exposure sequence.

The undesirable waiting times are done away with by way of the fact that each pixel of the printing plate is exposed with an individual exposure sequence selected in dependence of the surface density of the photo-polymerisation picture points to be set in the environment of the photo-polymerisation picture point. The steps according to the standard sequence according to the invention which directly follow one another without a time delay, in their result, lead to an exposure of the photo-polymerisation picture point at locations with the greatest surface density (shadows) with a total exposure dose. The total exposure dose is given by the sum of the preliminary exposure dose, the structure intensification dose as well as the standard dose. It corresponds to the exposure dose which is required in order to produce a photo-polymerisation picture point in a highly covered region (shadow) by way of polymerisation, in a manner such that its sticks to the subsurface of the printing plate.

The consideration of the surface density according to the present invention in this manner permits a significant improvement of the tonal range of the finished print picture, wherein simultaneously the total exposure time for the printing plate is drastically reduced due to the absence of the waiting time.

The exposure sequence for a given point on the printing plate thus according to the invention on the one hand naturally depends on whether this point is a picture point or not, whether therefore it is set or not. Inasmuch as this is concerned, the method according to the invention corresponds to the previously known standard method for producing a structure of photo-polymerisation picture points. With the method according to the invention, the exposure sequence however yet also depends on the surface density, thus on the environment of the point, of the photo-polymerisation picture points to be set, as well as the subsurface points which are not set. It is here where the method according to the invention differs from the previously known method.

According to the method according to the invention, thus the following cases are treated differently with respect to the selection of the exposure sequence:

(1) non-printing picture point in a region of medium surface density
(2) non-set picture point at a location with a large surface density
(3) set picture point at locations with medium or large surface density In the case 1, an exposure is carried out individually for the respective picture point of a preliminary exposure, in case 2 no preliminary exposure is carried out, since this would be counter productive as explained above, in case 3 the printing photo-polymerisation picture point is produced.

The method according to the present invention is improved even further, if additionally non-printing structure intensification points are produced at non-set picture points in an environment of photo-polymerisation picture points which are located at locations with a small surface density, wherein the structure intensification sequence comprises the following steps:

a) exposure with a preliminary exposure dose
b) exposure with a structure intensification dose.

Thus a non-printing part layer is therefore built up around the pixel to be printed in weakly covered surface regions, the so-called highlights, in which to some extent individually standing polymerisation picture points are located. Advantageously, the mechanical resistance of the pixel is supported in the development process as well as in the printing process by way of this. In the same manner, a supportive base is built up around individually standing pixels in a weakly covered environment, thus an environment with a low surface density. This base however is not printing on account of its smaller height compared to a printing pixel. The base does not therefore influence the print picture. The divergence of the light source here leads to a location-dependence of the light intensity, so that for example a different intensity acts in deeper layers than in higher layers of the printing plate.

According to the invention, by way of the structure intensification sequence, one exposes with a total dose of UV-light which results from the sum of the preliminary exposure dose and the structure intensification dose. By way of this, one achieves a condition on the surface of the printing plate, with which the light-sensitive layer is no longer completely water-soluble, as is the case in the unexposed condition of the light-sensitive layer.

With the development of the printing plate after completion of the exposure procedure, pixels are therefore no longer completely washed out on the printing plate surface which has been offset in this condition. The condition caused by the structure intensification sequence differs from the completely polymerised condition of a pixel as is produced by the standard sequence, however by way of the fact that the pixel does yet adhere fully on the subsurface of the printing plate. An irregular, sticky structure arises on the surface of the printing plate by way of this, which on the one hand is non-printing in order not to adulterate the picture, but which on the other hand contributes to the increase of the mechanical resistance of the photo-polymerisation picture point surrounded by the structure intensification points.

Additionally, the build-up of structure intensification points according to the invention has the advantage that the so-called bonding of the pixel to the printing plate substrate material is achieved more quickly by way of the additionally introduced exposure dose. The structure intensification points, inasmuch as this is concerned, act like a kind of bonding cement, with which an individually standing picture point is connected to the printing plate substrate material.

The described condition into which the structure intensification sequence shifts the structure intensification points, is defined by a very narrowly outlined exposure dose region. The structure intensification dose to be additionally added to the preliminary exposure dose is therefore relatively small. It corresponds to an intermediate condition between the mere preliminary exposure which serves according to the theory for bonding the free oxygen of the light-sensitive layer, and the dose deposited by the standard sequence, which leads to a complete polymerisation of the photo-polymerisation picture point.

A further advantage of the method according to the invention and of the inventive production of structure intensification picture points in an environment of individually standing photo-polymerisation picture points is the fact that the free oxygen is likewise bonded as already with the preliminary exposure, in the structure intensification point, so that the production of the individually freely standing picture point in the highlight region, thus in the region of very small surface density, is significantly simplified.

According to an advantageous embodiment of the method according to the invention, the environment is selected is a square manner. The mentioned advantages of the structure intensification points are particularly effectively utilised by way of this, since symmetrical relationships are present, so that a mechanical intensification of the picture point is achieved to the same extent in all directions.

According to another formation of the method according to the invention, it is even more advantageous if the extension of the environment is selected in dependence on the divergence of the light source. Advantageously, an optimal extension of the environment is always achieved for the structure intensification points by way of this. The more divergent the light source, the smaller is the irradiation energy which is incident onto the region within the layer below a pixel standing alone, thus a picture point within a region with a very small surface density (highlight). This leads to the fact that a lower and lower adhesion of the light-sensitive layer on the substrate material of the printing plate is effected with an increasing divergence of the light source. With a complete surface, the lower intensities of the individual pixels on the material lower side would again superimpose into the total intensity of the surface. This however is not possible in the case of picture points standing alone, thus highlights. The result of this therefore is that the structure intensification point requirement becomes larger, the larger is the divergence of the light source.

The method according to the invention is improved even further if the extension of the environment is selected in dependence on the layer thickness of the printing material on the printing plate. This measure too, has the advantage that one achieves a stabilisation of individually standing picture points, which is adapted to requirement. The mechanical stability of photo-polymerisation picture points on the substrate material becomes smaller, the larger the thickness of the light-sensitive layer on the printing plate, since with the same pixel area, the greater becomes the pixel height. The ratio between the pixel area to the pixel height thus reduces with an increasing layer thickness. From this, it results that the extension of the environment, within which its structure intensification points are to be produced, becomes larger, the thicker the light-sensitive layer is selected.

It has been shown to be particularly favourable, if in one embodiment of the method according to the invention, the extension of the environment corresponds to the product of the layer thickness and the quotient of the tangent of an aperture angle α of illumination optics and the pixel size.

According to one variant of the method according to the invention, it is envisaged for printing photo-polymerisation picture points (highlights) to be produced with a single picture point sequence at set picture points at locations with a small surface density, comprising the steps:

a) exposure with the preliminary exposure dose
b) exposure with the structure intensification dose
c) exposure with the standard dose
d) exposure with an individual picture point dose, wherein the individual picture point dose is selected such that together with the preliminary exposure dose, the structure intensification dose and the standard dose, it effects a complete polymerisation of the photo-polymerisation picture points at locations with the smallest surface density By way of this, one may make allowances for the phenomenon known in practise and underlined by theory, that one requires significantly more exposure time for the complete curing of highlights, thus of picture points in regions with a very low surface density, than for curing picture points in regions with a very high surface density. In practise, the required exposure times may differ by a factor of 10 to 100. The method according to the invention, on account of the individual selection of the exposure sequence for each point, permits this large variance of the respective optimal exposure doses to be ensured separately for each pixel. Thus according to this variant, on advantageously succeeds in producing also set picture points at locations with a small surface density as completely polymerised photo-polymerisation picture points firmly connected to the substrate material of the printing plate, without influencing the quality of the shadows. The factor by which the exposure times required for the different pixels differ, may be reduced to roughly the factor 2.

In a special design of the method according to the invention, it is envisaged that the exposure is carried out by way of an integrating digital screen imaging method (IDSI), with which light from the light source is imaged on a light modulator which comprises a plurality of rows of light-modulating cells, and is modulated by this, whereupon the light modulator is imaged onto the printing plate which is located in a relative movement to the light modulator, wherein the direction of the movement runs essentially parallel to the direction of the lines of light-modulating cells, and wherein the picture data is scrolled through the columns of the light modulator at a rate at which the imaging of the picture data is held essentially stationary relative to the printing plate during the movement, wherein the scrolling procedure is stopped in dependence on the exposure sequence provided for the respective photo-polymerisation picture point on the printing plate, according to a certain settable number of cells of the light modulator used for the exposure of the printing plate. With the integrating digital screen imaging method known per se, the picture content is shifted through the display in a direction opposite to the movement of the exposure head synchronously with the head speed. Thereby, by way of example, with a common design of the display, for example up to 768 lines are available through which picture information may be shifted. Then for each column, one may separately select through how many lines of the display the contained picture information is shifted. The larger the number of lines through which the picture information is shifted, the longer the exposure time, and accordingly the greater the exposure dose. The digital screen imaging method is therefore particularly well suited for carrying out the exposure method according to the invention with individual exposure sequences for each pixel. Known light modulators are suitable as light modulators, in particular micro-mirror arrangement (DMD), LCD matrix or e.g. reflecting liquid crystal matrices (LCOS). Magneto-optical cells or ferro-electrical cells are also in principle suitable The application of the integrating digital screen imaging method in a further formation of the method according to the invention, is even further improved if the picture data may be shifted into any column, in order from there to be transmitted to the next following columns.

According to a special particularly preferred embodiment of the method according to the invention, the light modulator is divided into four segments which consist of a selectable number of columns, are arranged behind one another with respect to the scrolling direction and which in each case correspond to a certain exposure dose. In this manner, advantageously a segment on the light modulator is allocated to each of the above mentioned individual doses, thus preliminary exposure dose, structure intensification dose, standard dose and individual picture point dose. Usefully the number of columns is selected according to the required dose. Thereby, it is the case that the larger the number of columns, the longer the exposure time, and accordingly the larger the exposure dose.

Accordingly, it is particularly advantageous in one design of the method according to the invention, for the number of columns of the segments amongst one another to behave as the contributions of the exposure doses. This is particularly advantageous with homogeneous illumination of the light modulator, since the exposure dose in this case is determined exclusively by the column number.

The invention is yet further improved, if the number of columns of the segments is selected taking into account a locationally dependent illumination intensity of the light modulator, which corresponds to the respective column. By way of this, one may take into account a possible inhomogeneous illumination of the light modulator, which is caused by inhomogeneities in the light source itself and/or by the illumination optics or by other factors.

For determining the photo-polymerisation picture point to be set at locations with the smallest surface density, in a further development of the method according to the invention, it is envisaged, proceeding from the initial picture, to carry out the following steps with the picture obtained in each case in the preceding step:
a) eliminating all pixels which have at least one non-set neighbour, preferably comprising a logical AND-link,
b) setting all pixels which comprise at least one set neighbour, preferably comprising a logical OR-link,
c) setting the pixels which are not set in the picture obtained by step b and are simultaneously set in the initial picture, preferably comprising a logical AND-link as well as a logical NOT-link.

The advantage of this method for determining the highlight points, thus picture points to be set in regions of a small surface density, is the fact that one exclusively uses simple logical links. In particular, no extreme, time-consuming derastering of the picture data is required for determining the surface density. Also, no loops need to be formed over lines and columns, where one enquires with regard to bits as to how the environment of the respective pixel is configured. Furthermore, no branches in the course of the program on account of enquiries is necessary.

The method according to the invention for determining the highlight regions in practise has been shown to be more than 100 times quicker than the mentioned conventional method. The method according to the invention may be adapted according to the material thickness of the light-sensitive layer on the printing plate, in a manner such that the pixel radius to be recognised as a highlight is increased by way of multiple application. As explained further above, with particularly great light-sensitive layers, it may already be necessary with a small group of picture points standing alone, to carry out an exposure according to the individual picture point sequence and not only with completely individually standing picture points.

Another variant of the method according to the invention for determining the pixels which are to be treated with the structure intensification sequence envisages the environment of the photo-polymerisation picture points at the location with the smallest surface density being determined from the picture data as follows:
a. setting pixels which have at least one adjacent polymerisation picture point at a location with the smallest surface density, preferably comprising an OR-link.

The advantage is that in this manner, the locations at which structure intensification points are to be produced, may be determined in the shortest of computation times on account of the use of simple logical operators. This has the advantage that the exposure may be carried out in a rapid and efficient manner.

A further formation of the method according to the invention envisages the evaluation of the pixels which are to be treated with the preliminary exposure sequence, being effected with the following method, wherein proceeding from the initial picture, the following steps are carried out with the respective picture obtained in the preceding step:
a) setting all pixels which have at least one set neighbour, preferably comprising a logical OR-link
b) deleting all pixels which have at least one non-set neighbour
c) setting all pixels which are part of the picture obtained in step b, but not part of the initial picture
d) inverting the picture obtained in step c.

In order with certain patterns, for example 2×2 chequerboard patterns, to achieve an unambiguous differentiation between pixels which are to be treated with the preliminary exposure sequence, and those pixels which are to be treated with a structure intensification sequence, according to one variant of the method according to the invention, it is envisaged for determining non-printing photo-polymerisation subsurface points, to link the picture obtained in step d) of claim 15 with the picture obtained in claim 14, by way of a logical OR-operation. By way of this, in case of doubt, the pixels are treated according to the structure intensification sequence, which is advantageous for a priorisation of the structure intensification for individual standing pixels, thus highlights.

If in contrast, the holding-open of non-printing picture points within regions with a large surface density, thus holes in shadows is to be given preference, one variant of the method according to the invention envisages the picture obtained in step d) of claim 15 to be linked with the picture obtained in claim 14, by way of a logical AND-operation for determining non-printing photo-polymerisation subsurface points. By way of this one succeeds in giving preference to the non-exposure, in cases such as for example 2×2 chequerboard patterns in which an allocation is possible for the case of no exposure as well as for the structure intensification exposure. The result of this is the fact that advantageously, the holding-open of non-set picture points which are edged by set picture points, is preferred.

An acceleration of the compete exposure procedure may be achieved with a further formation of the method according to the invention in that no exposure is effected at non-set picture points at locations with a disappearing surface density. These regions may then be completely left out by the exposure procedure. With conventional methods with which an unstructured preliminary exposure is effected, in contrast, these points are also preliminarily exposed, wherein the effect of the reversible bonding of oxygen obtained by the preliminary exposure would reverse anyway after a certain time. It is therefore advantageous for the temporal optimisation of the exposure procedure, if these regions are not exposed from the very beginning according to the method according to the invention.

The invention is explained by way of example in a preferred embodiment with reference to the drawings, wherein further advantageous details are to be deduced from the drawings.

Parts which are the same with regard to function are provided with the same reference numerals.

Figure 2:
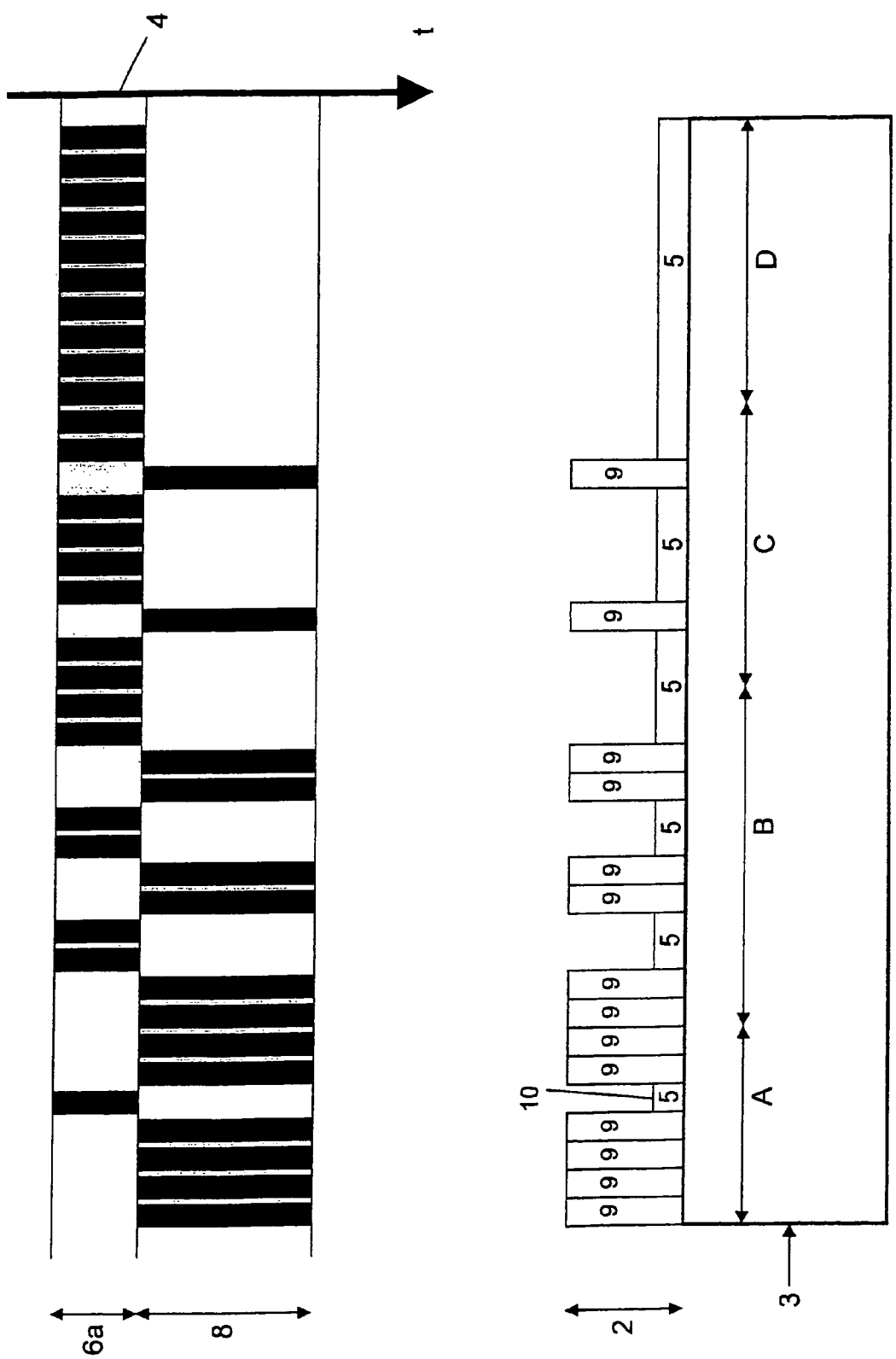
Figure 3:
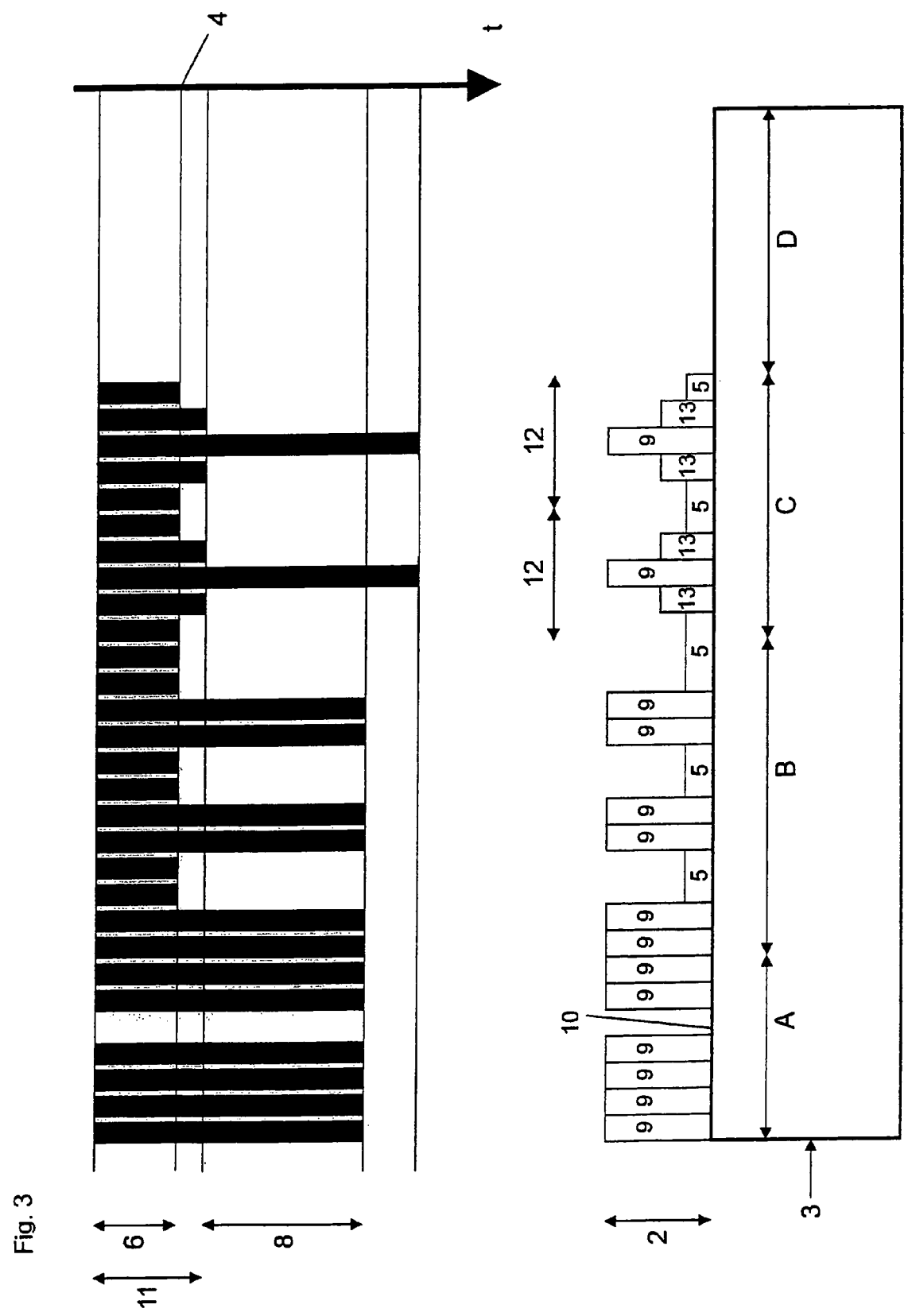
Figure 4:
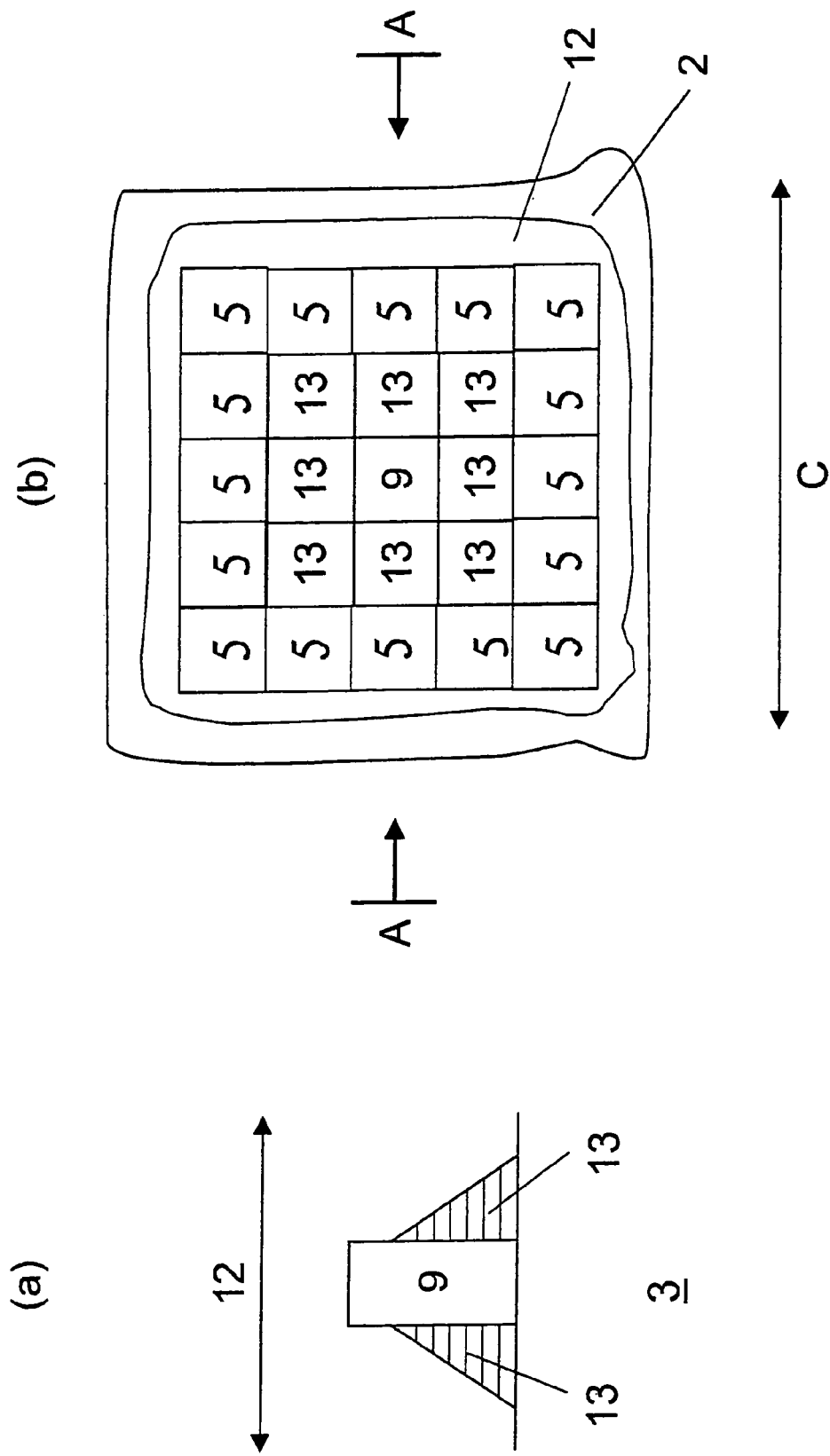
Figure 5:
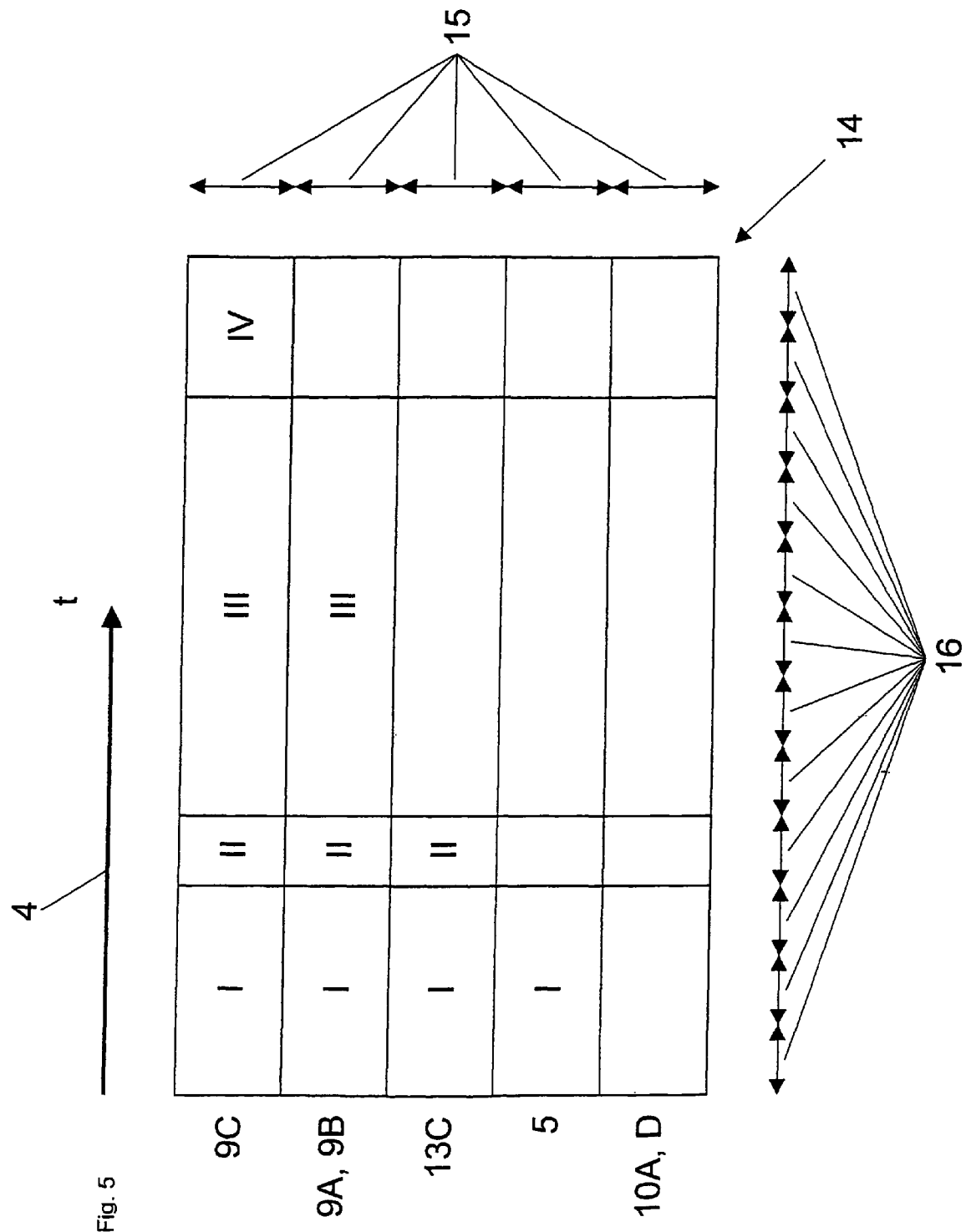

The Figures in the drawings individually show in:

FIG. 1: a cross section through a printing plate to be exposed, with a schematic representation of the exposure method according to the state of the art, FIG. 2: the representation of FIG. 1 for another known exposure method, FIG. 3: the representation of FIG. 1 for the method according to the present invention, FIG. 4*b*: a plan view of a highlight pixel standing alone, with the structure intensification according to the invention, FIG. 4*a*: a section along the line A-A in FIG. 4*b*, FIG. 5: a schematic representation of the segments on a display used for carrying out the method according to the invention.

Figure 6:
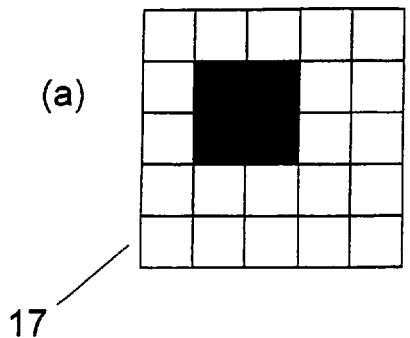
Figure 6:
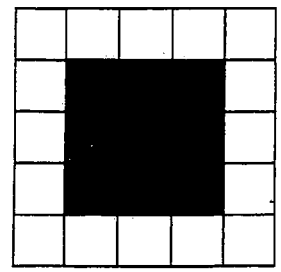
Figure 6:
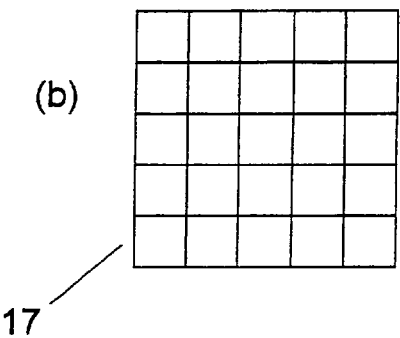
Figure 6:
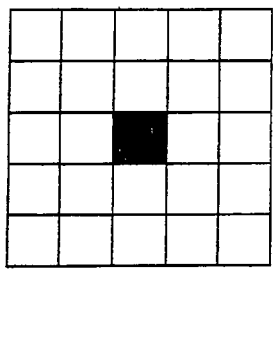
Figure 6:
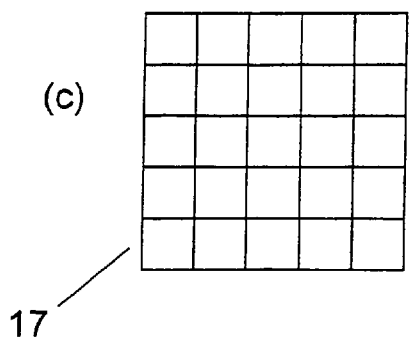
Figure 6:
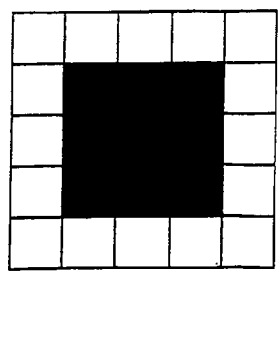

FIG. 6 a schematic illustration of the method for determining an individually standing pixel (highlight) according to the invention.

A printing plate 3 is to be recognised in cross section in FIG. 1. The surface of the printing plate is coated with a light-sensitive layer 2. The temporal course of an exposure method according to the state of the art is shown above the printing plate 3 in FIG. 1. The horizontal extension of the schematic diagram thereby corresponds to the location on the surface of the light-sensitive layer 2 of the printing plate 3 represented thereunder. The time axis 4 is plotted increasing downwards in the vertical extension. Therefore, the exposure sequence results for a given point on the light-sensitive layer 2 of the printing plate 3 by way of observing the section lying thereabove in the time diagram. Furthermore, a dark bar in the time diagram means that an exposure is effected at this location at the associated point in time. In contrast, the absence of a dark bar at a location at a given point in time or time interval means that no exposure is effected at this location and this point in time.

In the time diagram of FIG. 1, it is to be recognised that according to the previously known exposure method, firstly an unstructured exposure is effected with an preliminary exposure dose 6. As may be recognised in the schematic diagram in FIG. 1, the preliminary exposure 6 is effected in an unstructured manner and acts on the complete light-sensitive layer 2 of the printing plate 3 to the same extent. In the light-sensitive layer of the printing plate 3, the exposure with a preliminary exposure dose 6 produces a continuous layer of photo-polymerisations subsurface points 5. As may further be recognised in the time diagram of FIG. 1, the exposure is subsequently interrupted during a stop interval 7. According to theory, with this, the free oxygen reversibly bonded in the photo-polymerisation subsurface points 5 is partly released again.

The next thing to be deduced in the time diagram is that from now on, a structured exposure takes place according to the picture data. In each case, a photo-polymerisation picture point 9 is produced at the set picture points by way of the structured exposure sequence 8 in the light sensitive layer 2 of the printing plate 3.

The picture produced according to the known exposure method and illustrated in FIG. 1 is qualitatively unsatisfactory in may aspects. On the one hand, the danger exists that individual, unset picture points 10 in regions A with a large surface density of photo-polymerisation picture points 9 likewise undesirably polymerise through. This is due to the fact that photo-polymerisation subsurface points 9 are located between the polymerisation picture points 9 in the surface density region A, which have been produced by the preliminary exposure dose 6. By way of this, the free oxygen which is present without preliminary exposure in the light-sensitive layer and which counteracts photo-polymerisation, is no longer present. The result of this is that the individual, unset picture points 10 often grow together. On the other hand, with the known method according to the state of the art represented in FIG. 1, it is disadvantageous that photo-polymerisation picture points 9 in regions B of medium surface density or in regions C of a small surface density undesirably do not completely polymerise through, since the photo-polymerisation subsurface points 5 on account of the holding interval 7 already contain so much free oxygen, that the photo-polymerisation is prevented. This problem is particularly pronounced at photo-polymerisation picture points 9 in regions C of a small surface density (so-called highlight regions). On account of this, a production of photo-polymerisation picture points 9 in the regions of small surface density C is often completely impossible. Finally, an exposure with a preliminary exposure dose 6 in regions with disappearing surface density is insignificant to the end result. The production of photo-polymerisation subsurface points 5 in the regions D according to the known method may therefore be done away with.

FIG. 2 shows a schematic representation which is analogous to that shown in FIG. 1. In contrast to FIG. 1, FIG. 2 however shows another method for structured exposure of a printing plate 3 with a light-sensitive layer 2, which is previously known from the state of the art. As may be recognised in the time diagram, however with this known method, a preliminary exposure 6a is only effected at unset picture points in place of the unstructured preliminary exposure 6 of FIG. 1. This corresponds to a preliminary exposure with an inverse picture, thus with the negative. By way of this, a layer of photo-polymerisation subsurface points 5 which forms only at those locations within the light sensitive layer 2 at which no photo-polymerisation picture points 9 are to be produced, is produced in the light-sensitive layer 2 of the printing plate 3.

In the next structured exposure procedure 8 following directly with regard to time, the exposure with the actual picture information for producing the photo-polymerisation picture points 9 is effected as already in FIG. 1. With this previously known exposure method, there also exists the danger that individual, unset picture points 10 polymerise through in regions A of larger surface density in an undesirable manner, and thus limit the tonal range of the printing plate 3. Likewise, also with the known method represented in FIG. 2, an exposure of the regions D in which none at all of the photo-polymerisation picture points to be set are located, is effected without this bringing an advantage.

FIG. 3, in the same representational manner, which has already been selected for FIGS. 1 and 2, finally shows the method according to the present invention. From the time diagram of FIG. 3, one deduces that with the method according to the invention, the exposure of one and each point on the light-sensitive layer 2 of the printing plate 3 is selected in dependence on the surface density region A, B, C or D as well as in dependence on the picture information, thus whether a photo-polymerisation picture point 9 is to be set or not. No preliminary exposure dose 6 is deposited, in particular at individual, unset picture points 10 in regions of large surface density A (shadows). It is possible by way of this to cleanly separate these individual unset picture points 10 from the photo-polymerisation picture points 9. Here, the free oxygen within the light-sensitive layer 2 is advantageously utilised in a chemical-physical manner for suppressing the photo-polymerisation procedure.

A further particularity with the method according to the present invention, as is schematically represented in FIG. 3, is the treatment of individually standing photo-polymerisation picture points 9 in regions C of small surface density (so-called highlights). These as explained, one the one hand have the problem that on account of the fact that they are individually standing, in practise they require an increased dose for the complete photo-polymerisation of the light-permeable layer as well as its adhesion to the printing plate 3, for their complete photo-polymerisation. With the method according to the present invention, this condition is taken into consideration in that the photo-polymerisation picture points 9 in highlight regions C are produced with an extended exposure sequence 11. Furthermore, non-printing structure intensification points 13 are produced for an improved mechanical stabilisation of these photo-polymerisation picture points 9 in the surface dense regions C in an environment of this photo-polymerisation picture point.

The structure intensification points 13 are characterised in that the light-sensitive layer 2 is essentially no longer water-soluble, that however the structure intensification point 13 on the other hand, although adhering to the subsurface of the printing plate 3, does not adhere to the surface. The structure intensification points 13 thus act like a kind of cement for intensifying the individually standing photo-polymerisation picture point 9 in the region C of a small surface density.

In contrast, photo-polymerisation picture points 9 in regions A with the greatest surface density (shadow) and medium surface density B are only produced with the standard dose 8. The treatment of the non-set points in the surface dense regions A and B differs by way of the fact that non-printing photo-polymerisation subsurface points 5 are produced in the surface-dense regions, whereas these are not produced in the surface-dense regions A, as explained. Finally, the light-sensitive layer 2 is not exposed at all in the regions D of disappearing surface density, in which therefore no photo-polymerisation picture points 9 are provided at all.

FIG. 4 more accurately shows the conditions which prevail after the application of the method according to the invention on a photo-polymerisation point 9 which stands alone and which is located in a region C of a low surface density. In part (b) of the Figure, one may recognise a plan view of the light-sensitive layer 2 of the printing plate 3 with a photo-polymerisation picture point 9 which is located in a region C of smaller surface density and thus stands alone. The environment 12 around the photo-polymerisation picture point 9 standing alone may also be recognised. The environment 12 consists of several structure intensification points 13 which mechanically support the photo-polymerisation picture point 9 standing alone. The part (a) of FIG. 4 shows a section along line A-A which runs through the photo-polymerisation picture point 9 standing alone. One may recognise that the structure intensification points 13 support the photo-polymerisation picture point standing alone 9, at its base. A breaking-away of the photo-polymerisation picture point 9 standing alone is thus effectively prevented on account of the mechanically effect from the outside.

FIG. 5 in a plan view schematically shows the surface of a light modulator 14 with light-modulating cells arranged in lines 15 and columns 16. The use of a DMD-chip is particularly suitable according to the invention. However, other transmissive liquid crystal micro-display chips (LCD) or reflective liquid crystal matrices (LCOS) may be applied. The light modulator 14 permits the implementation of an integrating digital screen imaging method (IDSI), wherein the light modulator is imaged onto the printing plate 3. Simultaneously, the printing plate 3 is located in a relative movement to the light modulator 14. With the IDSI exposure method which is assumed to be known, the picture data is scrolled through the lines 15 of the light modulator 14 at a rate which has the effect that the image of the picture data is held essentially stationary relative to the printing plate 3 during the movement. The scrolling procedure may be stopped in dependence on the exposure sequence provided for the respective photo-polymerisation picture point 9 on the printing plate 3 after a certain, settable number of cells of the light modulator used for the exposure of the printing plate.

The lines 15 of the light modulator 14 are functionally divided up into four segments I, II, III, and IV consisting in each case of a selectable number of columns 16. The time axis 4 runs parallel to the lines 15 with this manner of the application of the IDSI method with the light modulator 14. Thus the widths of the segments I to IV, which are determined by the number of columns 16 in each case correspond to a time interval during which exposure takes place. Each segment thus with the given scroll conditions and with a given light source, corresponds to a certain illumination dose.

In detail, the preliminary exposure segment I corresponds to the preliminary exposure dose 6 from FIG. 3, which is necessary in order to bond the oxygen contained in the light-sensitive layer, without however a photo-polymerisation of the light-sensitive layer 2 being effected.

The structure intensification segment II corresponds to a structure intensification dose which is selected such that it, together with the mentioned preliminary exposure dose, produces a condition in which the light sensitive layer 2 is essentially no longer water soluble, but yet still adheres to the subsurface of the printing plate 3. A structure intensification point 13 is produced by an exposure by the preliminary exposure segment I and the structure intensification segment I.

The standard exposure segment III corresponds to the exposure with a standard dose (cf. 8 in FIG. 3). The standard dose 8 is selected such that together with the preliminary exposure dose 6 and the structure intensification dose in the regions A, B with large and medium surface density, it effects a complete photo-polymerisation of the photo-polymerisation picture point 9. Finally, the highlight segment IV corresponds to the dose which together with the preliminary exposure dose, the structure intensification dose and the standard dose, effects a complete polymerisation of the polymerisation picture points 9 standing alone, in the regions C with the smallest surface density.

Thus the segments I, II, II and IV on the light modulator 14 in the corresponding line 15 should be activated for producing a polymerisation picture point 9 in a region C with the smallest surface density. This case is indicated in FIG. 5 with the reference numerals 9, C in the first line.

For producing a photo-polymerisation picture point 9 in the region A or B with a large or medium surface density, in contrast, the activation of the segments I, II as well as III on the light modulator 14 is sufficient in order to produce a completely polymerised polymerisation picture point 9 adhering to the printing plate 3. This case is indicated in FIG. 5 in the line 2 with the alternatives 9, B as well as 9, A. In particular, one may recognise that for producing these points, the segment IV of the corresponding line is set to be inactive.

Furthermore, the exposure with the preliminary exposure dose 6 as well as the structure intensification dose 11 is necessary for the production of a structure intensification point 13 in the environment 12 of an individually standing polymerisation picture point 9 in a region C of small surface density. For this purpose, only the segments I and II are switched actively on the light modulator 12. This case is indicated in the third line of the light modulator 14 of FIG. 5 at 13, C.

Furthermore, only the preliminary exposure segment I is actively switched for producing photo-polymerisation subsurface points 5 in regions B of medium surface density. This case is indicated with the reference numeral 5 in front of the corresponding line of the light modulator 14 in FIG. 5.

Finally, an exposure is omitted with the production of a single, unset picture point 10 in a region A of large surface density, to the same extent as with an unset picture point in a region D of a disappearing surface density. Accordingly, none of the segments I to IV is actively set for the production of these points on the light modulator 14. This case is indicated in FIG. 5 with the alternatives D as well as 10, A.

Thus by way of the use of the integrating digital screen imaging method, a surprisingly simple implementation of the method according to the invention illustrated in FIG. 3 for the structured exposure of printing plates 3 is suggested which carries out an exposure of each point within the light-sensitive layer 2 of the printing plate 3 after the selections of one of the surface density regions A, B, C or D in dependence on picture information, thus whether a point is to be set in the picture or not.

FIG. 6 schematically illustrates a method according to the invention, for determining polymerisation picture points 9 which are located in regions C of a low surface density. Two exemplary picture point matrices 17 are represented in part (a) of FIG. 6 in the left and right column. The picture information represented in the left column of the part (a) of FIG. 6 corresponds to a 2×2 pixel large picture point, in whose environment no further set pixels are located. Thus with the example represented in the left picture of FIG. 6(a), it is the case of an individually standing polymerisation picture point 9 in a region C of low surface density. In contrast, a 3×3 large arrangement of picture points to be set is represented in the right column of part (a) of FIG. 6.

Then, in each case the converted picture produced from the initial picture to be recognised in part (a) of the figure is to be recognised in the part (b) of FIG. 6. The conversion according to the invention relates to the elimination of all pixels which have at least one non-set neighbour, wherein this is carried out with a logical AND-link. With the initial picture represented in the left column, this leads to the elimination of all pixels. In contrast, with the 3×3 arrangement of picture points according to the right picture, the central pixel is set, is thus not eliminated.

Finally, the picture obtained after a further processing step according to the invention is to be recognised in Fig. (c). The picture to be recognised in part (c) arises from that one which is shown in part (b), by way of setting all pixels which have at least one set neighbour. This operation is carried out with a logical OR-link which is possible with a minimal computation time. With the left picture, proceeding from the 2×2 picture structure, a structure without set pixels results by way of this, as represented. In contrast, in the picture shown on the right proceeding from the 3×3 picture, the initial picture of part (a) of FIG. 6 again arises.

If then the initial picture of part (a) of the Figure is compared to the picture in part (c) of the figure, one may decide whether individually standing pixels 9 in a region C of a small surface density are present or not. Highlight pixels are those pixels which in the picture from part (c) of the figure are not set, but however are set in the initial picture (cf. part (a) of FIG. 6). This is simple with regard to computation technology and is achieved in a very efficient manner by way of a logical AND-link as well as a logical NOT-link. Thus on account of this, a method which is surprisingly optimised with respect to computation time is suggested in order to recognise individually standing pixels from the picture data.

LIST OF REFERENCE NUMERALS 1 photo-polymerisation picture point
2 light-sensitive layer 3 printing plate
4 time axis
5 photo-polymerisation subsurface point
6 unstructured preliminary exposure dose
6a inverse preliminary exposure
7 holding interval
8 structured exposure
9 photo-polymerisation picture point
10 individual, unset picture points
11 structure intensification exposure sequence
12 environment
13 structure intensification point
14 light modulator
I preliminary exposure segment
II structure intensification segment
III standard exposure segment
IV highlight segment
15 lines
16 columns
17 picture pint matrix
A region of large surface density (shadow)
B region of medium surface density (main)
C region of small surface density (highlight)
D region of disappearing surface density.

The invention claimed is:

1. A method for producing a structure of photo-polymerization picture points in the light-sensitive layer of printing plates as an image of picture data composed from a matrix of picture points, by way of structured exposure with a light source, wherein each photo-polymerization picture point is produced by an individual exposure sequence selected in dependence on the one hand on the surface density of the photo-polymerization picture points to be set at a location of the photo-polymerization picture point, and on the other hand on the picture data, wherein at non-set picture points which are located at locations with medium surface density, non-printing photo-polymerization subsurface points are produced with a preliminary exposure sequence comprising the following step:
  exposure with a preliminary exposure dose, for bonding oxygen contained in the light-sensitive layer, wherein the preliminary exposure dose is selected such that photo-polymerization is still not yet effected,
and wherein at set picture points at locations with medium or large surface density, printing photo-polymerization picture points are produced with a standard sequence, comprising the following steps:
  a. exposure with the mentioned preliminary exposure dose;
  b. exposure with a structure intensification dose, wherein the structure intensification dose is selected such that together with the preliminary exposure dose, it produces a condition in which the light-sensitive layer is essentially no longer water-soluble, but yet still adheres on a subsurface of the printing plate; and
  c. exposure with a standard dose, wherein the standard dose is selected such that together with the preliminary exposure dose and the structure intensification dose at locations with the greatest surface density, it effects a complete photo-polymerization of the photo-polymerization picture point;
and wherein no exposure is effected at non-set picture points which are located at locations with a large surface density.

2. A method according to claim 1, wherein non-printing structure intensification points are produced by way of a structure intensification sequence at non-set picture points in an environment of photo-polymerization picture points which are located at locations with a small surface density, wherein the structure intensification sequence comprises the following steps:
  a) exposure with a preliminary exposure dose; and
  b) exposure with a structure intensification dose.

3. A method according to claim 2, wherein the environment is square.

4. A method according to claim 2, wherein the extension of the environment is selected in dependence on the divergence of the light source.

5. A method according to claim 2, wherein the extension of the environment is selected in dependence on the thickness of the light sensitive layer 6. A method according to claim 2, wherein the extension of the environment corresponds to the product of the thickness of the light-sensitive layer and the tangent of the quotient of an aperture angle of illumination optics and the pixel size.

7. A method according to claim 1, wherein the structure intensification dose corresponds to about 5% of the preliminary exposure dose.

8. A method according to claim 1, wherein printing photo-polymerization picture points are produced with an individual picture point sequence at set picture points at locations with a small surface density, comprising the steps:
  a) exposure with the preliminary exposure dose;
  b) exposure with the structure intensification dose;
  c) exposure with the standard dose; and
  d) exposure with an individual picture point dose, wherein the individual picture point dose is selected such that together with the preliminary exposure dose, the structure intensification dose and the standard dose, it produces a complete polymerization of the photo-polymerization picture points at locations with the smallest surface density.

9. A method according to claim 1, wherein the exposure is carried out by way of an integrating digital screen imaging method, with which light from the light source is imaged on a light modulator which comprises a plurality of rows of light-modulating cells, and is modulated by this, whereupon the light modulator is imaged onto the printing plate which is located in a relative movement to the light modulator, wherein the direction of the movement runs essentially parallel to the direction of the lines of light-modulating cells, and wherein the picture data is scrolled through the columns of the light modulator at a rate at which the image of the picture data is held essentially stationary relative to the printing plate during the movement, wherein the scrolling procedure is stopped in dependence on the exposure sequence provided for the respective photo-polymerization picture point on the printing plate after a certain settable number of cells of the light modulator used for the exposure of the printing plate.

10. A method according to claim 9, wherein the picture data may be shifted into any column, in order from there, to be transmitted to the next following columns.

11. A method according to claim 9, wherein the light modulator is divided into four segments which consist in each case of a selectable number of columns are arranged one after the other with respect to the scrolling direction, and in each case correspond to a certain exposure dose.

12. A method according to claim 9, wherein the number of columns of the segments amongst one another behave as the contributions of the exposures doses.

13. A method according to claim 1, wherein the photo-polymerization picture points at locations with the smallest surface density are determined from the picture data wherein, proceeding from the initial picture, the following steps are carried out with the picture contained in each case in the preceding step:
- a) eliminating all pixels which have at least one non-set neighbor;
- b) setting all pixels which comprise at least one set neighbor; and
- c) setting the pixels which are not set in the picture obtained by step b and simultaneously set in the initial picture.

14. A method according to claim 13, wherein the environment of the photo-polymerization picture points at locations with the smallest surface density is determined from the picture data as follows:
- a. setting pixels which have at least one adjacent polymerization picture point at a location with the smallest surface density.

15. A method according to claim 1, wherein for determining non-printing photo-polymerization subsurface points one proceeds as follows, wherein proceeding from the initial picture, the following steps are carried out with the respective picture obtained in the preceding step:
- a) setting all pixels which have at least one set neighbor;
- b) deleting all pixels which have at least one non-set neighbor;
- c) setting all pixels which are part of the picture obtained in step b, but not part of the initial picture; and
- d) inverting the picture obtained in step c.

16. A method according to claim 14, wherein for determining non-printing photo-polymerization subsurface points the picture obtained by inverting a picture in a method determining bump regions is linked with the picture obtained in claim 14 by way of a logical OR-operation.

17. A method according to claim 14, wherein for determining non-printing photo-polymerization subsurface points the picture obtained by inverting a picture in a method determining bump regions is linked with the picture obtained in claim 14 by way of a logical AND-operation.

18. A method according to claim 1, wherein no exposure is effected at non-set picture points at locations with a disappearing surface density.

19. A method according to claim 9, wherein the number of columns of the segments is selected while taking into account a positionally-dependent illumination intensity of the light-modulator, said intensity corresponding to the respective column.

* * * * *

UNITED STATES PATENT AND TRADEMARK OFFICE
CERTIFICATE OF CORRECTION

| | | |
|---|---|---|
| PATENT NO. | : 7,851,134 B2 | Page 1 of 1 |
| APPLICATION NO. | : 11/480619 | |
| DATED | : December 14, 2010 | |
| INVENTOR(S) | : Eggers | |

It is certified that error appears in the above-identified patent and that said Letters Patent is hereby corrected as shown below:

In particular, in Column 16, line 59 (Line 3 of Claim 11), after the word "columns" please insert: --,--.

In Column 16, line 67 (Line 3 of Claim 13), after the word "data" please insert: --,--.

In Column 18, line 5 (Line 2 of Claim 16) after the word "points" please insert: --,--.

In Column 18, line 10 (Line 2 of Claim 17) after the word "points" please insert: --,--.

Signed and Sealed this
Twenty-sixth Day of April, 2011

David J. Kappos
*Director of the United States Patent and Trademark Office*